(12) United States Patent
Takeno et al.

(10) Patent No.: US 6,544,899 B2
(45) Date of Patent: Apr. 8, 2003

(54) PROCESS FOR MANUFACTURING SILICON EPITAXIAL WAFER

(75) Inventors: Hiroshi Takeno, Annaka (JP); Norihiro Kobayashi, Annaka (JP)

(73) Assignee: Shin-Etsu Handotai Co., Tokyo (JP)

(*) Notice: Subject to any disclaimer, the term of this patent is extended or adjusted under 35 U.S.C. 154(b) by 0 days.

(21) Appl. No.: 10/019,298

(22) PCT Filed: May 1, 2001

(86) PCT No.: PCT/JP01/03758

§ 371 (c)(1),
(2), (4) Date: Jan. 4, 2002

(87) PCT Pub. No.: WO01/86710

PCT Pub. Date: Nov. 15, 2001

(65) Prior Publication Data

US 2003/0008480 A1 Jan. 9, 2003

(30) Foreign Application Priority Data

May 9, 2000 (JP) .......................... 2000-135837

(51) Int. Cl.[7] ............................................. H01L 21/469
(52) U.S. Cl. ..................... 438/765; 438/476; 438/511; 438/769
(58) Field of Search ................. 438/765, 769, 438/476, 511

(56) References Cited

U.S. PATENT DOCUMENTS

| | | | |
|---|---|---|---|
| 5,998,283 A | * 12/1999 | Takamizawa et al. | 438/476 |
| 6,030,894 A | * 2/2000 | Hada et al. | 438/675 |
| 6,143,071 A | 11/2000 | Aihara et al. | 117/89 |
| 6,204,203 B1 | * 3/2001 | Narwankar et al. | 438/785 |
| 6,323,093 B1 | * 11/2001 | Xiang et al. | 438/299 |

FOREIGN PATENT DOCUMENTS

| | | |
|---|---|---|
| JP | A-151035 A | 6/1990 |
| JP | A-3-50737 A | 3/1991 |
| JP | A-5-121319 | 5/1993 |
| JP | A-11-67781 | 3/1999 |
| JP | 0971055 A2 | 1/2000 |
| JP | A-2000-31150 | 1/2000 |

* cited by examiner

Primary Examiner—Richard Elms
Assistant Examiner—Pho M. Luu
(74) Attorney, Agent, or Firm—Arent Fox Kintner Plotkin & Kahn PLLC

(57) ABSTRACT

There is provided a process for manufacturing a silicon epitaxial wafer capable of manufacturing an epitaxial wafer, which exerts a stable IG capability without being affected by a thermal history of a substrate for epitaxial growth and has the IG capability excellent from an early stage of a device process, and particularly, canceling an IG shortage in an N/N$^+$ epitaxial wafer caused by a problem that oxygen precipitation is hard to proceed in an N$^+$ substrate with a simple and easy way. RTA (rapid heating and rapid cooling heat treatment) is performed at a temperature of 1200° C. to 1350° C. for 1 to 120 seconds on a silicon substrate for epitaxial growth; further heat treatment is performed at a temperature of 900° C. to 1050° C. for 2 to 20 hours on the silicon substrate for epitaxial growth; and thereafter, an epitaxial layer is formed on a surface of the silicon substrate.

2 Claims, 3 Drawing Sheets

PROCESS FOR MANUFACTURING SILICON EPITAXIAL WAFER

TECHNICAL FIELD

The present invention relates to a process capable of manufacturing an epitaxial wafer which exerts a stable IG capability without being affected by a thermal history of a substrate for epitaxial growth and has the IG capability excellent from an early stage of a device process.

BACKGROUND ART

In a silicon wafer prepared using a silicon single crystal grown by a Czochralski (CZ) method, interstitial oxygen is included as an impurity at a concentration of the order ranging from $5 \times 10^{17}$ to $10 \times 10^{17}$ atoms/cm$^3$. The interstitial oxygen is supersaturated in a period of a thermal history from solidification of a grown crystal until the crystal being cooled to room temperature in a pulling operation (hereinafter referred to as a crystal thermal history) so that the interstitial oxygen precipitates to form oxygen precipitation nuclei (microprecipitates of silicon oxides).

When the silicon wafer is subjected to heat treatment in a process for fabricating a semiconductor integrated circuit, the oxygen precipitation nuclei are grown to progress oxygen precipitation, with the result that there are generated oxide precipitates and micro-defects such as dislocations caused thereby. The oxide precipitates existing in a device active layer of the wafer surface deteriorate device characteristics, while those in the interior of the wafer work effectively as sites capturing heavy metal impurities to exert an effect called IG (Internal Gettering), the device characteristics and a yield of the devices being improved. From this viewpoint, control of oxygen precipitation in a CZ wafer is an important issue and researches thereon have extensively been conducted for a long time.

In order to make it defect-free a device formation region in the vicinity of the wafer surface, there is sometimes used an epitaxial wafer (hereinafter also simply referred to as an epi-wafer) prepared by depositing a silicon single crystal layer (hereinafter also simply referred to as an epitaxial layer or an epi-layer) on a CZ wafer in vapor phase growth. In this epi-wafer as well, it is important that an IG capability is added to a substrate thereof.

However, when ordinary epitaxial growth is performed at a high temperature of 1000° C. or higher, oxygen precipitation nuclei that have been formed in a crystal thermal history of pulling a silicon single crystal from which an epitaxial growth substrate is obtained become solid solutions, oxygen precipitation being suppressed in a device fabrication process compared with an ordinary CZ silicon wafer not heat-treated. Therefore, reduction of an IG capability in an epi-wafer becomes a problem.

As measures to solve this problem, there is a process in which a substrate is subjected to heat treatment at a temperature on the order of 800° C. prior to an epitaxial process to grow oxygen precipitation nuclei to a large size with the result that the oxygen precipitation nuclei are not annihilated even in an epitaxial process at a high temperature (for example, see JP A 98-223641), a process, as described in Japanese Patent Application No. 2000-17479 filed by the present applicant, in which oxygen precipitation nuclei are reproduced by heat treatment at a temperature on the order of 450 to 750° C. after an epitaxial process, and other processes.

However, since the process in which the substrate is subjected to heat treatment prior to the epitaxial process utilizes oxygen precipitation nuclei formed in a crystal thermal history, a density of oxygen precipitation nuclei differs depending on a crystal thermal history of a wafer; therefore, a density of oxide precipitates varies according to differences in conditions for pulling a crystal or in crystal positions, so there arises a problem that a stable gettering capability is not attained. Further, oxygen precipitation is inherently hard to proceed in an N$^+$ substrate doped with Sb (antimony) or As (arsenic) at a high concentration (a silicon wafer having a conductivity type of n-type and resistivity of 0.1 Ω·cm or lower) so that a density of oxygen precipitation nuclei formed in a crystal thermal history is low to make an effect of heat treatment prior to an epitaxial process almost nothing.

Furthermore, since formation of oxygen precipitation nuclei in the N$^+$ substrate is hard to proceed even in heat treatment after an epitaxial process, a problem again arises that a long heat treatment time is required to attain a sufficiently high density. As for a reason why oxygen precipitation is hard to proceed in the N$^+$ substrate, several models thereon have already been proposed, but it is not as yet clear, so descriptions thereon is not provided here.

On the other hand, an N/N$^+$ epitaxial wafer using an N$^+$ substrate (an epi-wafer prepared by growing an n-type epitaxial layer having resistivity of 0.1 Ω·cm or higher on an N$^+$ substrate) is regarded as promising materials for CCD from a structural viewpoint. However, an IG effect cannot be expected therefrom as described above; an N/N epi-wafer (an epitaxial wafer prepared by growing an n-type epitaxial layer having resistivity of 0.1 Ω·cm or higher on an n-type substrate having resistivity of 0.1 Ω·cm or higher) is widely used instead thereof In this case as well, in order to add an IG effect, heat treatment for oxygen precipitation is required before or after an epitaxial process. In consideration of such circumstances, it is an important problem to add an IG effect to an N/N$^+$ epi-wafer with a relatively simple and easy way.

As a simple and convenient method to accelerate oxygen precipitation, there is available rapid heating and rapid cooling heat treatment called RTA (Rapid Thermal Annealing) (see JP A 94-504878, for example). In many cases, a heat treatment apparatus capable of performing this type of heat treatment (an RTA apparatus) adopts a lamp heating system, in which heat treatment can be realized at a temperature increase/decrease rate on the order of 10 to 100° C./sec.

Excess vacancies introduced from a wafer surface in the RTA process are considered to facilitate oxygen precipitation. However, it has been understood that the precipitation acceleration effect is cancelled by performing an epitaxial process immediately after the RTA. This is imagined because vacancies outdiffuse in the epitaxial process. While the oxygen precipitation effect further increases in heat treatment at a temperature on the order of 450° C. to 800° C. after the RTA, no sufficient growth of oxide precipitates is achieved due to the low heat treatment temperature and the oxide precipitates cannot survive in a high temperature epitaxial process. Especially, an N$^+$ substrate in which oxygen precipitation is hard to occur is greatly affected thereby.

A low temperature device process introduced in recent years suppresses growth of oxide precipitates, so there is a fear that a sufficient gettering capability is not secured. Therefore, it is preferable that oxide precipitates having a large size to a detectable level are formed at a stage prior to a device process. In a prior art process, however, it was hard to form oxide precipitates having a detectable size immediately after an epitaxial process.

DISCLOSURE OF THE INVENTION

It is an object of the present invention to provide a process for manufacturing a silicon epitaxial wafer capable of manufacturing an epitaxial wafer, which exerts a stable IG capability without being affected by a thermal history of a substrate for epitaxial growth and has the IG capability excellent from an early stage of a device process, and particularly, canceling an IG shortage in an N/N$^+$ epitaxial wafer caused by a problem that oxygen precipitation is hard to proceed in an N$^+$ substrate with a simple and easy way.

In order to solve the above problem, a process for manufacturing a silicon epitaxial wafer of the present invention comprises the steps of: performing RTA (rapid heating and rapid cooling heat treatment) at a temperature of 1200° C. to 1350° C. for 1 to 120 seconds on a silicon substrate for epitaxial growth; further performing heat treatment at a temperature of 900° C. to 1050° C. for 2 to 20 hours on the silicon substrate for epitaxial growth; and thereafter, forming an epitaxial layer on a surface of the silicon substrate. This process is particularly effective for an n-type silicon wafer having resistivity of 0.1 Ω·cm or lower and can manufacture an epitaxial wafer having an excellent IG capability even at a high temperature of 1100° C. or higher in formation of the epitaxial layer.

In order that oxide precipitates exist at a sufficiently high density in the interior of a substrate after epitaxial growth, conditions for RTA are necessarily 1200° C. or higher and 1 second or longer, but a high temperature in excess of 1350° C. is not preferable because of a possibility of producing problems of metal contamination into a wafer, generation of slip dislocations and others. Furthermore, a heating time in excess of 120 seconds causes problems of reduction in throughput, durability of a heat treatment furnace and others, being unrealistic.

Furthermore, especially in an N$^+$ substrate, in order to ensure a sufficient density of oxide precipitates (at least $1 \times 10^7/cm^3$) in the interior of the substrate after epitaxial growth, heat treatment at a temperature of 900° C. or higher for 2 hours or longer is required as heat treatment conditions after the RTA; heat treatment in excess of 20 hours is nonsense due to saturation of an effect thereof. On the other hand, heat treatment at a temperature in excess of 1050° C. is not preferable since formation of new oxygen precipitation nuclei becomes difficult in the interior of the substrate.

BEST MODE FOR CARRYING OUT THE INVENTION

Description will be given of one embodiment of the present invention with reference to FIG. 1 of the accompanying drawings and it is needless to say that the embodiment in the figure is shown by way of illustration and various modification or variations can be performed as far as not departing from the technical concept of the present invention.

Figure 1:
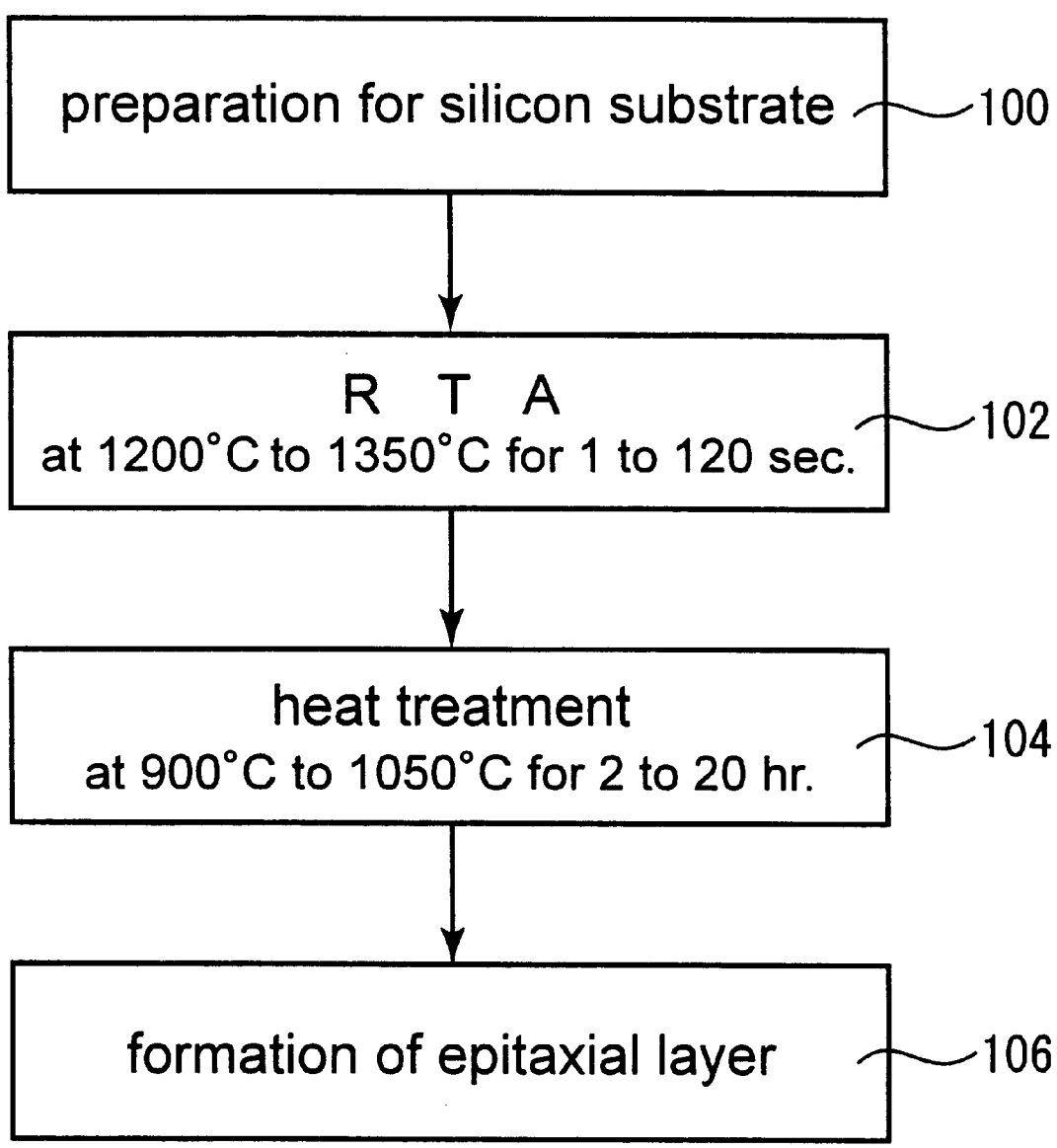
FIG. 1 is a flow chart showing a step sequence of a process for manufacturing a silicon epitaxial wafer of the present invention.

FIG. 1 is a flow chart showing a step sequence of a process for manufacturing a silicon epitaxial wafer of the present invention. First of all, a silicon substrate for epitaxial growth is prepared (step 100). The silicon substrate in use is preferably of a conductivity type of n-type and resistivity of 1.0 Ω·cm or lower. RTA (Rapid Thermal Annealing, which is a rapid heating and rapid cooling heat treatment) is performed on the silicon substrate (step 102). The RTA is performed under conditions of a temperature of 1200° C. to 1350° C. for 1 to 120 seconds. Outside the conditions, as described above, the function and effect of the present invention cannot sufficiently be achieved.

After the RTA is terminated, the silicon substrate is further subjected to heat treatment (step 104). The heat treatment is performed under conditions of a temperature of 900° C. to 1050° C. for 2 to 20 hours. Outside the conditions, as described above, the function and effect of the present invention cannot effectively be achieved. An epitaxial layer is formed on a surface of the silicon substrate subjected to the heat treatment (step 106). Formation of the epitaxial layer is performed at a high temperature of 1000° C. or higher as in a prior art with no problem. Note that a heat treatment atmosphere in the step 104 is not specially limited, but where the heat treatment is performed in an oxidative atmosphere, the epi-process is required to be performed after an oxide film formed on the silicon substrate is removed.

Thus, in a manufacturing process of the present invention, there are annihilated in a high temperature RTA process oxygen precipitation nuclei formed by a crystal thermal history of a silicon single crystal from which a silicon substrate for epitaxial growth is prepared, after the RTA, with application of the heat treatment at a relatively high temperature (900° C. to 1050° C.), oxygen precipitation nuclei are formed and concurrently grown to form oxide precipitates which are not annihilated even in an epi-process in the silicon substrate for epitaxial growth, and epitaxial growth is performed using the silicon substrate. In this process, even immediately after the epitaxial process, an epitaxial wafer can be attained that has oxide precipitates of a size detectable by a measuring apparatus using infrared laser scattering tomography.

Accordingly, since even in an N$^+$ substrate oxide precipitates have been grown at a stage prior to an epi-process, there can be manufactured an epitaxial wafer with an IG capability from an early stage of a device process. Furthermore, since oxygen precipitation nuclei formed in a crystal thermal history are annihilated in the RTA process, an epitaxial wafer can be manufactured with a stable IG capability having no variation due to the crystal thermal history.

Still furthermore, vacancies originally present in a wafer and vacancies introduced in the RTA process are removed from a region in the vicinity of the wafer surface by outdiffusion in subsequent heat treatment; therefore, a defect-free region (a DZ layer) of oxide precipitates is formed in the vicinity of the wafer surface, which advantageously acts on crystallinity of an epitaxial layer formed thereon.

EXAMPLES

While description will be given of the present invention in a more concrete manner taking up examples below, it is needless to say that the examples are shown by way of illustration only and should not be construed by way of limitation.

Example 1

There were prepared Sb doped substrates each having a diameter of 6 inches, a crystal orientation of <100>, an initial oxygen concentration of 15 ppma [JEIDA (Japan Electronic Industry Development Association) standard]. The resistivity thereof is about 0.02 Ω·cm. The substrates were subjected to RTA at 1200° C. for 30 seconds in a nitrogen atmosphere. Thereafter, the substrates were subjected to heat treatment at temperatures of 900° C., 1000° C. and 1050° C. for 2 to 16 hours. The heat treatment atmosphere was a nitrogen atmosphere containing 2% oxygen (2% $O_2/N_2$). Then, an oxide film on a surface of each substrate after the heat treatment was removed, and after an epitaxial layer was grown on the substrate at 1150° C. to a thickness of 3 μm, an oxide precipitate density was measured by infrared laser scattering tomography.

Figure 2:
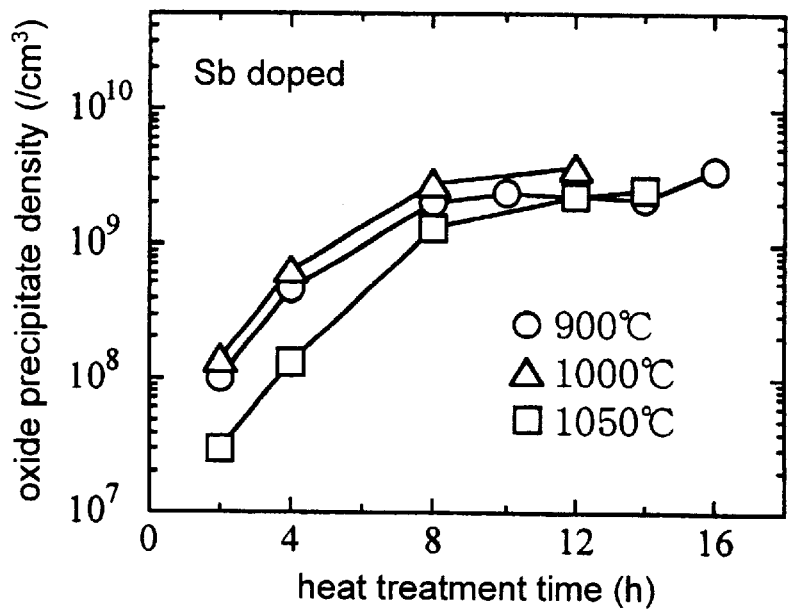
FIG. 2 is a graph showing relationships between a heat treatment time after RTA and an oxide precipitate density at each temperature in Example 1.

In FIG. 2 are shown relationships between a heat treatment time after the RTA and an oxide precipitate density at each temperature. At any of tested temperatures oxide precipitate densities were already observed in the order of $10^7/cm^3$ or more for the heat treatment of 2 hours and the densities increased with increase in the heat treatment time. It was found from the results that, in a Sb doped substrate where oxygen precipitation is hard to proceed, by the RTA and the subsequent heat treatment there were formed oxide precipitates which are not annihilated in a high temperature epi-process and further of a size sufficiently detectable at a stage immediately after the epi-process.

Example 2

There were prepared As doped substrates each having a diameter of 6 inches, a crystal orientation of <100>, an initial oxygen concentration of 16.5 ppma. The resistivity thereof is about 0.005 Ω·cm. The substrates were subjected to RTA at 1200° C. for 30 seconds in a nitrogen atmosphere as in Example 1. Thereafter, the substrates were subjected to heat treatment at temperatures of 900° C., 1000° C. and 1050° C. for 2 to 16 hours (2% $O_2/N_2$). Then, an oxide film on a surface of each substrate after the heat treatment was removed, and after an epitaxial layer was grown on the substrate at 1125° C. to a thickness of 5 μm, an oxide precipitate density was measured by infrared laser scattering tomography.

Figure 3:
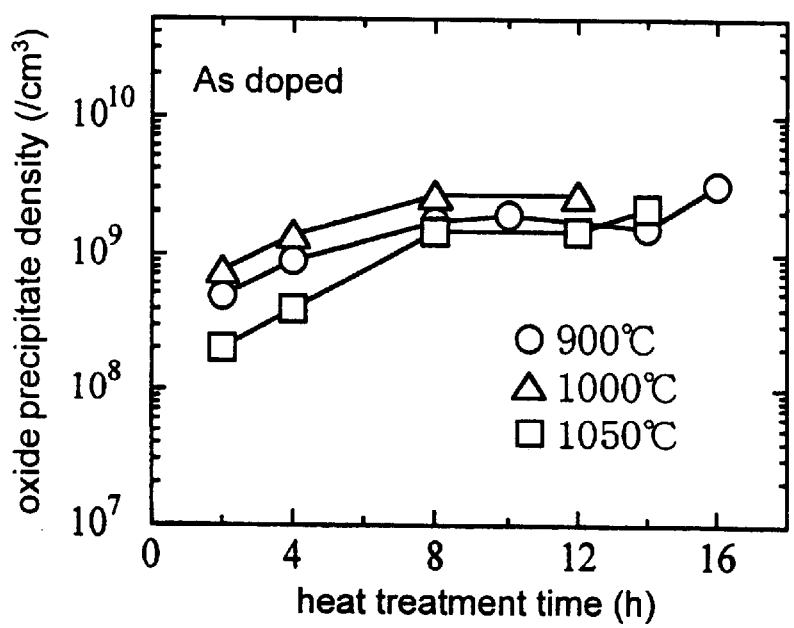
FIG. 3 is a graph showing relationships between a heat treatment time after RTA and an oxide precipitate density at each temperature in Example 2.

In FIG. 3 are shown relationships between a heat treatment time after the RTA and an oxide precipitate density at each temperature. At any of tested temperatures oxide precipitate densities were already observed in the order of $10^8/cm^3$ or more for the heat treatment of 2 hours and the densities increased with increase in the heat treatment time. It was found from the results that in an As doped substrate as in the Sb doped substrate by the RTA and the subsequent heat treatment there were formed oxide precipitates which are not annihilated in an epi-process and further of a size sufficiently detectable at a stage immediately after the epi-process.

Note that the reason why the densities in cases of short heat treatment times are slightly higher than those in Example 1 is considered due to a difference in the oxygen concentrations.

Example 3 and Comparative Example 1

Experiments were carried out for investigation of an influence of a RTA temperature. Sb doped substrates as in Example 1 were subjected to RTA for 30 seconds in a nitrogen atmosphere. The respective RTA temperatures were 1150° C. (Comparative Example 1), 1200° C. and 1250° C. (Example 3).

After the RTA, the substrates were subjected to heat treatment at a temperature of 1000° C. for 8 hours (2% $O_2/N_2$). Then, an oxide film on a surface of each substrate after the heat treatment was removed, and after an epitaxial layer was grown on the substrate at 1150° C. to a thickness of 3 μm, an oxide precipitate density was measured by infrared laser scattering tomography.

Figure 4:
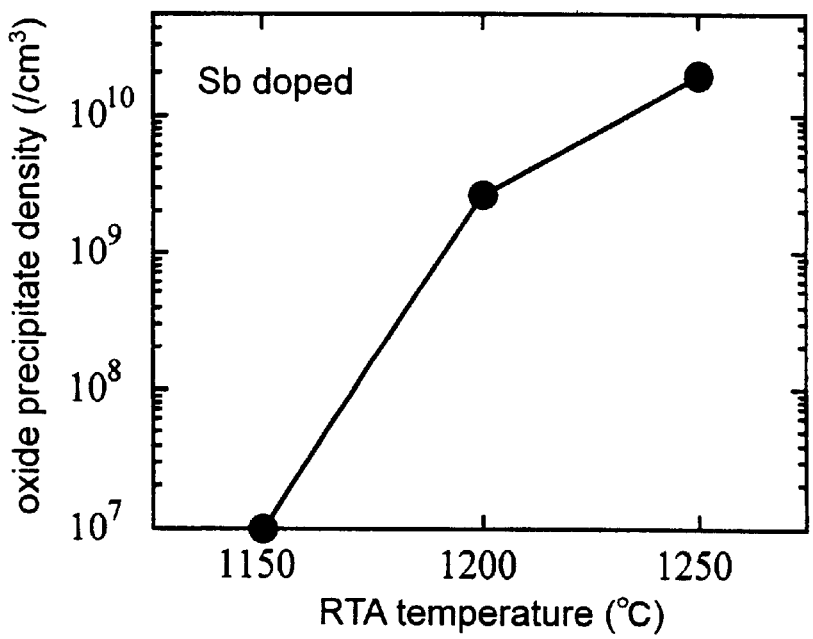
FIG. 4 is a graph showing a relationship between a heat treatment time after RTA and an oxide precipitate density at each temperature in Example 3 and Comparative Example 1.

In FIG. 4 is shown a relationship between an RTA temperature and an oxide precipitate density. An oxide precipitate density at 1150° C. was at a low level of $1 \times 10^7/cm^3$ or lower, but oxide precipitates were observed at densities in the order of $10^9/cm^3$ at 1200° C. or higher. It was found from the results that an RTA temperature of 1200° C. or higher was preferable.

Example 4

Experiments were carried out for investigation of an influence of an atmosphere in RTA. Sb doped substrates as in Example 1 were subjected to RTA at 1250° C. for 30 seconds in a hydrogen atmosphere. After the RTA, the substrates were subjected to heat treatment at 900° C. and 1050° C. for 2 to 14 hours (2% $O_2/N_2$. Then, an oxide film on a surface of each substrate after the heat treatment was removed, and after an epitaxial layer was grown on the substrate at 1150° C. to a thickness of 3 μm, an oxide precipitate density was measured by infrared laser scattering tomography.

Figure 5:
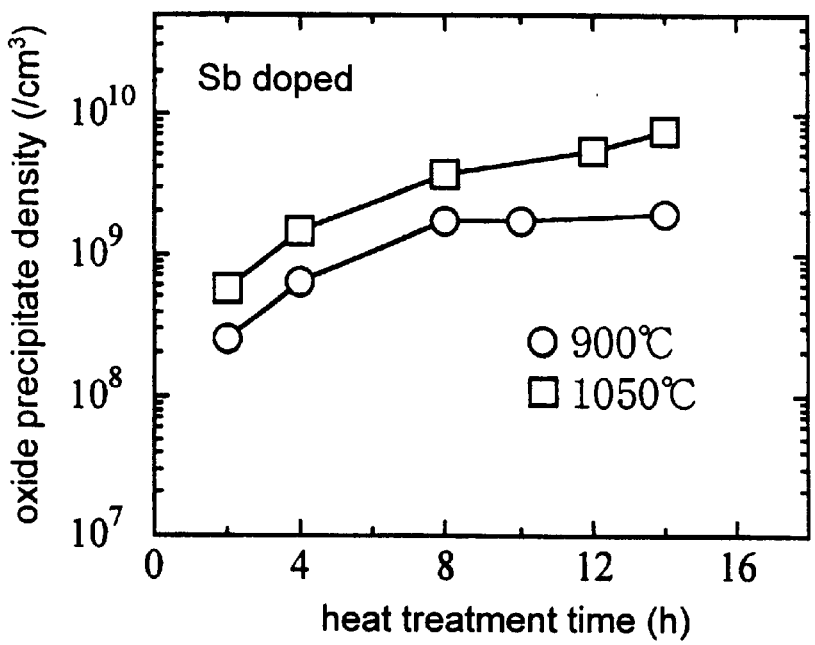
FIG. 5 is a graph showing relationships between a heat treatment time after RTA and an oxide precipitate density at each temperature in Example 4.

In FIG. 5 are shown relationships between a heat treatment time after the RTA and an oxide precipitate density at each temperature. At any of tested temperatures the oxide precipitate densities were already observed in the order of $10^{8/cm^3}$ or more for the heat treatment of 2 hours and the densities increased with increase in the heat treatment time. It was found from the results that, even in case where the RTA was performed in a hydrogen atmosphere, by the RTA and the subsequent heat treatment there were formed oxide precipitates which are not annihilated in an epi-process and further of a size sufficiently detectable at a stage immediately after the epi-process.

Comparative Example 2

There were prepared Sb doped substrates and As doped substrates as in Example 1 and Example 2, respectively. An epitaxial layer was grown on each of the substrates at 1150° C. to a thickness of 3 μm without being subjected to RTA and a subsequent heat treatment, and thereafter an oxide precipitate density was measured by infrared laser scattering tomography. It was observed from the results that in any of the substrates the oxide precipitate densities were $5 \times 10^6/cm^3$ or lower, which were much lower, compared with those in the Examples.

Comparative Example 3

There were prepared Sb doped substrates and As doped substrates as in Example 1 and Example 2, respectively. The substrates were subjected to RTA at 1200° C. for 30 seconds in a nitrogen atmosphere. Thereafter, the substrates were subjected to heat treatment at 800° C. for 2 hours (2% $O_2/N_2$). Then, an oxide film on a surface of each substrate after the heat treatment was removed, and after an epitaxial layer was grown on the substrate at 1150° C. to a thickness of 3 μm, an oxide precipitate density was measured by infrared laser scattering tomography. The results of the measurement showed that in any of the substrates the oxide precipitate densities were $1\times10^7/\text{cm}^3$ or lower.

It was found from the above-described results of Examples 1 to 4 and Comparative Examples 1 to 3 that the Sb and As substrates are subjected to the RTA and the heat treatment of 900° C. to 1050° C. of the present invention, whereby there can be formed oxide precipitates having a sufficient density even after an epi-process.

Note that since a sufficient level of the effect of the present invention can be attained even in Sb and As doped $N^+$ substrates where oxygen precipitation is hard to proceed, a sufficient level of the effect can be ensured in a low resistivity B (boron) doped substrate and an ordinary resistivity P (phosphorus) or B (boron) doped substrate where oxygen precipitation is easy to proceed.

Capability of Exploitation in Industry

According to the present invention, as described above, there can be obtained an epitaxial wafer, which exerts a stable IG capability without being affected by a thermal history of a substrate for epitaxial growth and has the IG capability excellent from an early stage of a device process; and particularly, a sufficient IG capability can be obtained even in an $N/N^+$ epitaxial wafer using an $N^+$ substrate where oxygen precipitation is hard to proceed.

What is claimed is:

1. A process for manufacturing a silicon epitaxial wafer comprising the steps of:

performing RTA (rapid heating and rapid cooling heat treatment) at a temperature of 1200° C. to 1350° C. for 1 to 120 seconds on a silicon substrate for epitaxial growth;

further performing heat treatment at a temperature of 900° C. to 1050° C. for 2 to 20 hours on the silicon substrate for epitaxial growth; and thereafter, forming an epitaxial layer on a surface of the silicon substrate.

2. A process for manufacturing a silicon epitaxial wafer according to claim 1, wherein the silicon substrate for epitaxial growth is a conductivity type of n-type and resistivity of 0.1 Ω·cm or lower.

* * * * *